United States Patent [19]

Tyc et al.

[11] Patent Number: 5,231,295
[45] Date of Patent: Jul. 27, 1993

[54] SUPERCONDUCTING FIELD EFFECT TRANSISTOR

[75] Inventors: Stephane Tyc, Paris; Alain Schuhl, Clamart, both of France

[73] Assignee: Thomson-CSF, Puteaux, France

[21] Appl. No.: 745,880

[22] Filed: Aug. 16, 1991

[30] Foreign Application Priority Data

Aug. 21, 1990 [FR] France .................. 90 10513

[51] Int. Cl.⁵ .................. H01L 39/22; H01B 12/00
[52] U.S. Cl. .................. 257/38; 257/36; 257/39; 505/1; 505/701; 505/832; 505/817
[58] Field of Search .......... 357/4, 5; 505/1, 702, 505/832, 817; 257/36, 38, 39

[56] References Cited

U.S. PATENT DOCUMENTS

| | | | |
|---|---|---|---|
| 4,950,643 | 8/1990 | Agostinelli et al. | 505/725 |
| 5,059,581 | 10/1991 | Vasquez | 505/728 |
| 5,070,375 | 12/1991 | Sakai | 357/4 |

FOREIGN PATENT DOCUMENTS

| | | | |
|---|---|---|---|
| 0093557 | 11/1983 | European Pat. Off. | |
| 0185104 | 6/1986 | European Pat. Off. | |
| 2194667 | 8/1990 | Japan | 357/5 |

OTHER PUBLICATIONS

Takaoka et al., "Superconductivity of (Pb, Sn, Ge) Te Semiconductor Film with a Little Pb Inclusion", Jap. J. of Appl. Phys., vol. 26, (1987) Supplement 26-3.

Patent Abstracts of Japan, vol. 12, No. 44, (E-581)[2891], Feb. 9, 1988, K. Tanabe, et al., "Superconducting Three-Terminal Device"; & JP-A-62 195 189, Aug. 27, 1987.

Physical Review Letters, vol. 66, No. 23, Jun. 10, 1991, J. M. Baranowski, et al., "Evidence for Superconductivity in Low-Temperature-Grown GaAs", pp. 3079-3082.

Solid State Communications, vol. 76, No. 1, 1990, pp. 31-34, GB, T. Koshindo, et al., "Enhancement of Superconducting Transition Temperature by Photo-Carriers in Indium Doped Pb1-xSnxTe Film with Lead Inclusion".

Japanese Abstract, vol. 14, No. 28, (E-875)(3971) Jan. 19, 1990, JP-A-1-265576, Noboru Ebara, Oct. 23, 1989, "Ceramic Superconductive Transistor".

Primary Examiner—Rolf Hille
Assistant Examiner—M. Saadat
Attorney, Agent, or Firm—Oblon, Spivak, McClelland, Maier & Neustadt

[57] ABSTRACT

A field-effect transistor comprises, on a substrate, a layer of semiconductor material incorporating natural or artificial inclusions of superconducting material. The source, drain and gate electrodes are made on this layer. Applications: field-effect transistors with low gate control voltage. FIG. 3.

29 Claims, 2 Drawing Sheets

SUPERCONDUCTING FIELD EFFECT TRANSISTOR

BACKGROUND OF THE INVENTION

1. Field of the Invention

The invention relates to a field-effect transistor that uses superconductivity and, more particularly, to a field-effect transistor, the channel of which is made alternately superconductive or resistive by the application of an electrical field to the gate.

Components based on a superconductive effect have two main fields of application: these are the field of ultrasensitive detection (especially in the infrared) and that of logic applications with very little dissipation and high switching speeds. However, it does not appear to be simple to achieve logic applications without using three-terminal components (indeed, logic circuits based on Josephson junctions are difficult to set up).

2. Description of the Prior Art

A great many three-terminal applications have been proposed to date. These include, especially, a Josephson field-effect transistor (JOFET) as described in the document by A. W. KLEINWASSER et al. in "Superconducting Devices", S. Ruggiera and D. Rudman Academic Press Inc., San Diego, 1990. The working principle is identical to that of the FET except that the electrodes are made of superconducting material and that the semiconductor channel bears a superconductive current which is itself modulated by the gate voltage (see FIG. 1). The superconductive current may get propagated in the semiconductor by means of the well-known effect of proximity between normal metals and superconductors, which has also been demonstrated between semiconductors and superconductors.

However, no component of the JOFET group has yet been made with characteristics that are good enough to be useful.

Furthermore, the superconductivity of a layer (channel) may be controlled by modulating the electron density in certain particular systems. In lead salts, which are superconductors with a small forbidden band, small effective mass and high mobility, it is possible to prepare semiconductor layers having inclusions of metallic lead slugs as described in the document by S. Tanaka et al., "Controllability of Superconducting Behavior by Photo-Illuminations in Indium-Doped $Pb_{1-x}Sn_xTe$ With Lead Inclusion", 20th Conference of Semiconductors, Thessaloniki, Greece, Aug. 6, 1990. At low temperatures, these inclusions become superconducting, and the existence of a superconducting current between these inclusions is a function of the electron density in the semiconductor matrix. This effect has been demonstrated in the document by Takaoka et al. Improvements in the critical temperature of the system have been obtained by making the electron density in the semiconducting matrix vary through the photoexcitation of electrons (illumination).

FIG. 2a shows, according to the Takaoka document, lead inclusions in a $Pb_{1-x}Sn_xTe/In$ material and shows (in the hatched zones) the penetration of the superconducting state into the semiconducting material ($Pb_{1-x}Sn_xTe/In$).

FIG. 2b brings out the fact that, when this device is exposed to light, its superconducting regions get extended and its superconductivity increases.

The drawbacks of the approach using JOFETs are twofold. Firstly, to obtain superconductive currents that are not negligible when compared with the normal current, it is necessary to have channel lengths that are extremely small and hence difficult to manufacture. Secondly, the voltages between source and drain, at which the superconducting effects are great, are intrinsically limited by the gap energy of the Cooper pairs (about 1 mV in the older superconductors, and 10 mV in the new ones) while the gate voltages required to modulate the conduction in the channel are of the order of several hundreds of mV at the minimum.

The system described in the article by Takaoka et al. has the drawback of having very lengthy response times; the photo-excited electrons get recombined very slowly.

SUMMARY OF THE INVENTION

The invention therefore concerns a field-effect transistor that overcomes these drawbacks.

The invention therefore concerns a field-effect transistor comprising, on a substrate, a layer of a semiconductor material containing inclusions (that are natural or artificial as in quantum boxes) made of a superconducting material, a gate electrode positioned between a drain electrode and a source electrode, the gate electrode being controlled by a gate voltage.

Furthermore, according to the invention, the gate, drain and source electrodes have either ohmic contacts made of normal conductive material or connections made of superconducting material.

BRIEF DESCRIPTION OF THE DRAWINGS

The different objects and features of the invention will appear more clearly in the following description, given by way of example, and in the appended figures, of which.

MORE DETAILED DESCRIPTION

Figure 1:
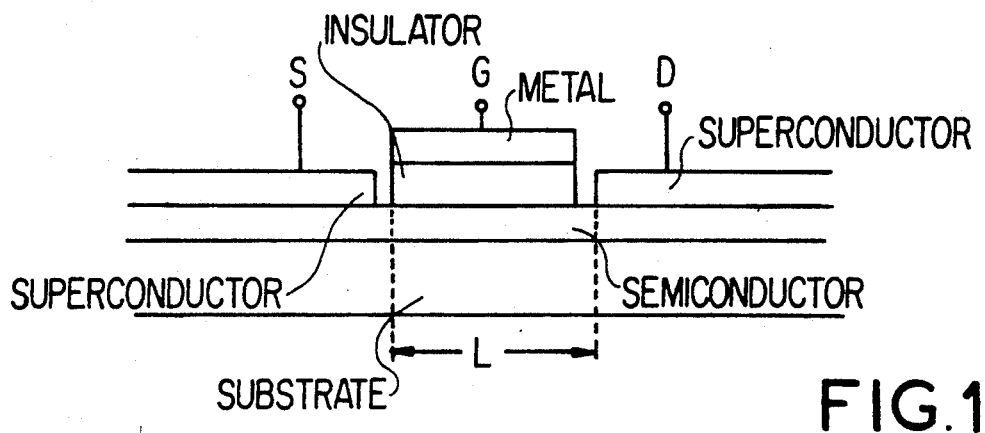
FIGS. 1, 2a and 2b show known prior art devices described here above.
Figure 2A:
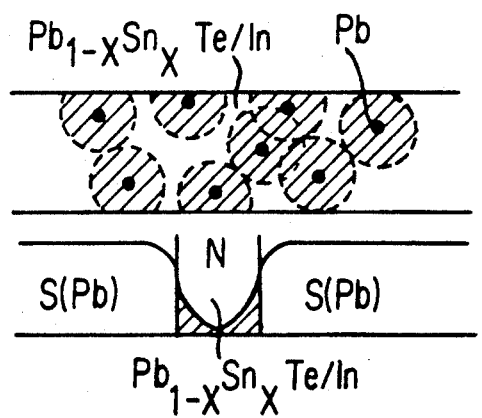
Figure 2B:
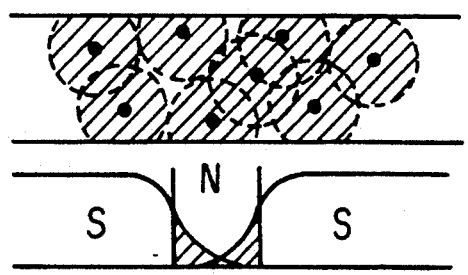
Figure 3:
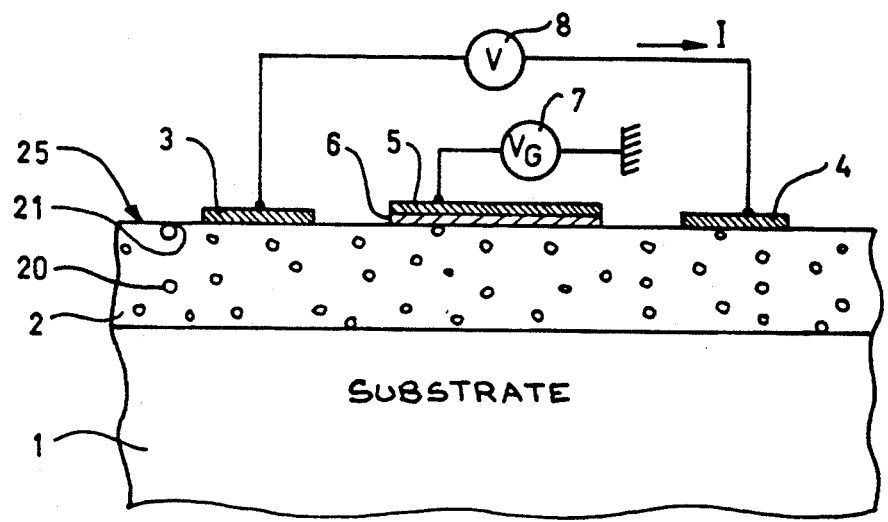
FIG. 3 shows an exemplary embodiment of the device according to the invention.

The exemplary embodiment of the device of the invention shown in FIG. 3 has, on a substrate 1, a layer 2 of semiconductor material with inclusions of superconducting material, such as 20 and 21, distributed in the thickness of the layer 2.

On the surface 25 of the layer 2, there are localized a drain electrode 3 and a source electrode 4 connected to a bias source 8.

Between these two electrodes, there is a gate electrode 5 to which there is connected a control gate voltage source 7.

The drain and source electrodes 3 and 4 are made by means of ohmic contacts. These ohmic contacts are preferably made of a normal conductive material or a superconducting material.

The gate electrode 5 may be made in the form of a Schottky contact. As shown in FIG. 3, it may also include a layer of an insulator material 6 located between a contact layer 5 and the layer 2. The electrode 5 may also be a p-n junction or any other known device enabling the modulation of the electron density in the layer 2.

In this way, the supercurrent between the drain and the source is controlled by the voltage applied to the gate. This voltage modulates the electron density in the channel and allows or does not allow the supercurrent to get propagated from one electrode to the other by percolation through the superconducting inclusions.

In FIG. 3, the embodiment is such that the distribution of inclusions is not completely controlled. The inclusions are made naturally during the making of the layer 2.

Figure 4:
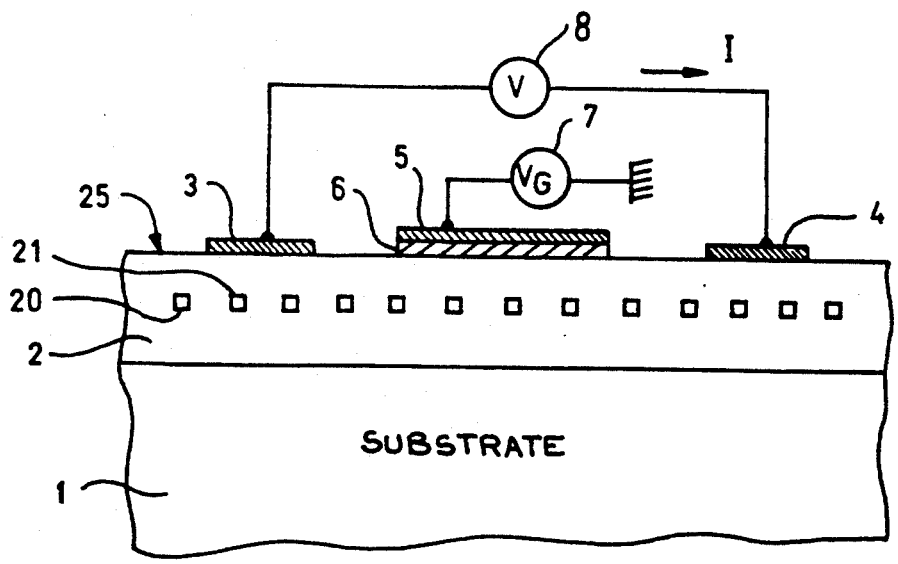
FIG. 4 shows an alternative embodiment of the device according to the invention.

FIG. 4 shows an embodiment in which the inclusions are made in the form of quantum boxes, the position of which can be controlled according to the technique for the making of quantum boxes.

The invention thus makes it possible to resolve the problem of the proximity of the superconducting electrodes in having small distances between the superconducting inclusions. This makes it possible to lower the electron density needed in the semiconductor matrix to set up a superconductive current and, thereby, to reduce the control voltage of the gate.

The invention also enables the series connection of systems equivalent to small elementary JOFETS between the superconducting inclusions, and leads to drain-source voltages greater than the gap energy of the Cooper pairs.

According to a practical embodiment of the device according to the invention, the layer 2 is a lead salt such that:

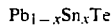

or

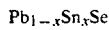

with x ranging substantially from 0 to 0.5.

For example, x may have a value of 0.25.

The inclusions of superconducting material (20, are then lead inclusions that get formed when the layer 2 is made. The percentage of lead inclusions is, for example, 1%.

In this exemplary embodiment, the layer 2 has a thickness substantially of 100 nm or less than 100 nm.

The source and drain electrodes 3 and 4 are ohmic contacts made of gold.

If the gate has an insulator layer 6, the ohmic contact 5 may be made of gold.

According to one alternative embodiment of the invention, the layer 2 made of semiconducting material is made of PbS.

According to another alternative embodiment, the layer 2 is made of InAs or InGaAs. The inclusions of superconducting material may then be indium (In) or gallium (Ga).

According to yet another alternative embodiment, the layer 2 may also be made of low-temperature-grown GaAs. In such a material, there is a part of it that may be superconducting, as described in the article by J. M. Baranowski et al. in "Evidence for Superconductivity in Low-Temperature-Grown GaAs", *Physical Review Letters*, volume 66. No. 23, 10 June 1991.

It is quite clear that the above description has been given purely by way of a non-restrictive example, and that other variants may be envisaged. The numerical examples and the examples of materials have been given purely in order to illustrate the description.

What is claimed is:

1. A field-effect transistor comprising, on a substrate, a layer of a semiconductor material containing inclusions made of a superconducting material and, positioned on the surface of the layer of semiconductor material, a gate electrode positioned between a drain electrode and a source electrode, a channel current underneath the gate electrode being controlled by a gate voltage.

2. A field-effect transistor according to claim 1, wherein the inclusions are distributed evenly in the layer of semiconductor material.

3. A field-effect transistor according to claim 1, wherein the gate, drain and source electrodes comprise ohmic contacts made of normal conductive material 4. A field-effect transistor according to claim 1, wherein the gate, drain and source electrodes comprise contacts made of superconducting material.

5. A field-effect transistor according to either of the claims 3 or 4, wherein the gate electrode includes a layer of insulator material between the contact and the layer of semiconductor material.

6. A field-effect transistor according to claim 1, wherein the gate electrode includes a Schottky contact.

7. A field-effect transistor according to either of the claims 3 or 4, wherein the semiconductor material is a lead salt and wherein the inclusions of superconducting material are lead-based.

8. A field-effect transistor according to claim 7, wherein the lead salt has the formula:

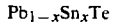

with substantially $0<x<0.5$.

9. A field-effect transistors according to claim 7, wherein the lead salt is PbS.

10. A field-effect transistor according to either of the claims 3 or 4, wherein the semiconductor material is made of InAs and wherein the inclusions of superconducting material are indium-based.

11. A field-effect transistor according to either of the claims 3 or 4, wherein the semiconductor material is made of InAs and wherein the inclusions of superconducting material are gallium-based.

12. A field-effect transistor according to claim 1, wherein the gate electrode includes a p-n junction.

13. A field-effect transistor according to claim 7, wherein the lead salt has the formula:

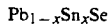

with substantially $0<x<0.5$.

14. A field-effect transistor according to either of claims 3 or 4, wherein the semiconductor material is made of GaInAs and wherein the inclusions of superconducting material are indium-based.

15. A field-effect transistor according to either of claims 3 or 4, wherein the semiconductor material is made of GaInAs and wherein the inclusions of superconducting material are gallium-based.

16. A field effect transistor comprising:
   a substrate;
   a layer of semiconducting material formed on the substrate, the layer of semiconductor material containing inclusions of a superconducting material evenly distributed in semiconductor material;
   a drain electrode formed on the layer of semiconductor material;
   a source electrode formed on the layer of semiconductor material;

a gate electrode formed on the layer of semiconductor material between the drain electrode and the source electrode, a channel current underneath the gate electrode being controlled by a gate voltage.

17. A field-effect transistor according to claim 16, wherein the gate, drain and source electrodes comprise ohmic contacts made of normal conductive material.

18. A field-effect transistor according to claim 16, wherein the gate, drain and source electrodes comprise contacts made of superconducting material.

19. A field-effect transistor according to one of claims 17 or 15, further comprising a layer of insulator material formed between the gate electrode and the layer of semiconductor material.

20. A field-effect transistor according to claim 16, wherein the gate electrode includes a Schottky contact.

21. A field-effect transistor according to one of claims 17 or 18, wherein the semiconductor material is a lead salt and wherein the inclusions of superconducting material are lead-based.

22. A field-effect transistor according to claim 21, wherein the lead salt has the formula:

$$Pb_{1-x}Sn_xTe$$

with substantially $0 < x < 0.5$.

23. A field-effect transistor according to claim 21, wherein the lead salt is PbS.

24. A field-effect transistor according to either of claims 17 and 18, wherein the semiconductor material is made of InAs and wherein the inclusions of superconducting material are indium-based.

25. A field-effect transistor according to either of claims 17 and 18, wherein the semiconductor material is made of InAs and wherein the inclusion of superconducting material are gallium-based.

26. A field-effect transistor according to claim 16, wherein the gate electrode includes a p-n junction.

27. A field-effect transistor according to claim 21, wherein the lead salt has the formula:

$$Pb_{1-x}Sn_xSe$$

with substantially $0 < x < 0.5$.

28. A field-effect transistor according to either of claims 17 and 18, wherein the semiconductor material is made of GaInAs and wherein the inclusions of superconducting material are indium-based.

29. A field-effect transistor according to either of claims 17 and 18, wherein the semiconductor material is made of GaInAs and wherein the inclusions of superconducting material are gallium-based.

* * * * *